(12) United States Patent
Bock et al.

(10) Patent No.: US 7,352,267 B2
(45) Date of Patent: Apr. 1, 2008

(54) CYLINDRICALLY SHAPED SUPERCONDUCTOR COMPONENT AND ITS USE AS RESISTIVE CURRENT LIMITER

(75) Inventors: Joachim Bock, Erftstadt (DE); Steffen Elschner, Heidelberg (DE); Frank Breuer, Bonn (DE)

(73) Assignee: Nexans, Paris (FR)

( * ) Notice: Subject to any disclaimer, the term of this patent is extended or adjusted under 35 U.S.C. 154(b) by 0 days.

(21) Appl. No.: 11/191,234

(22) Filed: Jul. 27, 2005

(65) Prior Publication Data

US 2007/0063798 A1  Mar. 22, 2007

(30) Foreign Application Priority Data

Jul. 30, 2004  (EP) .................... 04300502

(51) Int. Cl.
*H01F 1/00* (2006.01)
*H01F 6/00* (2006.01)
*H01F 7/00* (2006.01)

(52) U.S. Cl. ........................... 335/216; 338/20
(58) Field of Classification Search ............... 335/216, 335/224; 361/93.3; 338/20
See application file for complete search history.

(56) References Cited

U.S. PATENT DOCUMENTS

| 3,913,044 | A | * | 10/1975 | Albrecht et al. ............. 335/216 |
| 4,270,112 | A | * | 5/1981 | Schneider-Muntau et al. ........................ 336/197 |
| 4,688,132 | A | * | 8/1987 | Dustmann .................... 361/19 |
| 4,956,740 | A | * | 9/1990 | Williams ..................... 361/19 |
| 5,140,290 | A | * | 8/1992 | Dersch ....................... 505/211 |
| 5,231,369 | A | * | 7/1993 | Preisler et al. .............. 505/210 |
| 5,235,309 | A | * | 8/1993 | Preisler et al. .............. 505/210 |
| 5,280,247 | A | * | 1/1994 | DeMeester et al. ......... 324/318 |
| 5,506,199 | A | * | 4/1996 | Bock et al. ................. 505/450 |
| 5,917,393 | A | * | 6/1999 | Kupiszewski et al. ....... 335/216 |
| 5,949,311 | A | * | 9/1999 | Weiss et al. ................ 333/202 |
| 6,177,856 | B1 | * | 1/2001 | Chen et al. ................... 338/13 |
| 6,693,504 | B1 | * | 2/2004 | Snitchler et al. ............ 335/216 |
| 6,809,910 | B1 | * | 10/2004 | Yuan et al. ................... 361/19 |
| 6,869,916 | B2 | * | 3/2005 | Gauss et al. ................ 505/490 |
| 7,023,209 | B2 | * | 4/2006 | Zhang et al. ................ 324/318 |
| 7,048,840 | B1 | * | 5/2006 | Werfel et al. ................. 205/51 |
| 7,064,363 | B2 | * | 6/2006 | Lowther et al. ............. 257/277 |
| 7,119,644 | B2 | * | 10/2006 | Snitchler et al. ............ 335/216 |
| 2006/0226941 | A1 | * | 10/2006 | Dimig et al. ............... 335/220 |

\* cited by examiner

*Primary Examiner*—Elvin Enad
*Assistant Examiner*—Mohamad A Musleh

(57) ABSTRACT

The present invention is directed to a cylindrically shaped superconductor component particularly useful as resistive current limiter composed of a cylindrical superconductor body, in particular of high temperature superconductor material, provided vertically to its longitudinal axis with a number of azimuthal slots 3, incised in parallel and alternating, and one longitudinal slot 2 running parallel to the longitudinal axis over almost the whole length of the cylindrical superconductor body.

11 Claims, 1 Drawing Sheet

CYLINDRICALLY SHAPED SUPERCONDUCTOR COMPONENT AND ITS USE AS RESISTIVE CURRENT LIMITER

RELATED APPLICATION

This application is related to and claims the benefit of priority from European Patent Application No. 04 300 502.4, filed on Jul. 30, 2004, the entirety of which is incorporated herein by reference.

FIELD OF THE INVENTION

The present invention relates to a superconductor component with substantially cylindrical cross-section, in particular a high temperature superconductor component, and its use as resistive current limiter.

BACKGROUND OF THE INVENTION

Superconductors, in particular ceramic high-temperature superconductors, offer a great potential as fault current limiters which enable rapid and effective current limitation, automatic recovery, negligible impedance during normal operation and application at high voltage.

Such resistive current limiters are capable of switching off the current within a very short time such as about 2 ms to protect large rectifier installation and other electrotechnical equipment against short circuit currents.

There are known different embodiments of current limiters.

In so called resistive (ohmic) limiters the superconductive element becomes normally conductive if a critical current level is exceeded. This transition is also termed "quenching". Further, such superconductor current limiters have the capability to return to its superconducting state after the current limiting event.

They are also known so called inductive current limiters. When applied with fault currents, the inductive current limiter provides a high impedance which limits the fault currents below a threshold level. For example, U.S. Pat. No. 5,140,290 discloses an inductive current limiter in which the current to be limited flows through an inductive coil. A hollow cylinder of a high temperature superconductor is arranged in the interior of this coil, and a soft magnetic material with high permeability is arranged concentrically inside.

In normal operation (rated current) the superconductivity of the hollow cylinder shields the magnetic fields of the induction coil completely from the coil and impedance of the induction coil is maintained at a very low level. When a fault current flows through the induction coil the superconductivity of the cylindrical body disappears and the impedance of the induction coil reaches its maximum current limiting value.

In general the resistance of the superconducting material in its normal conducting state depends on the length of the conductor. Thus, for obtaining optimum current limitation the conductor requires a very long length. For practical operation it is necessary that despite the required length the conductor should occupy only a volume as small as possible.

There are several proposals for increasing the electrically active length of a conductor whereas its volume and linear extent, respectively, does not exceed a predetermined value.

In EP 5 235 309 a resistive current limiter is disclosed having the shape of an orthogonal plate. Into the sides extending parallel to the longitudinal axis of the plate a defined number of slots is cut which extend vertically with respect to the longitudinal axis of the plate. That is, the slots are cut into these two longitudinal sides such that they alternate. This forms a meandering conductor from the plate. Due to the meandering form the active length along which the current flows is significantly increased depending on the number of slots without increasing the actual volume. The ends of the conductor thus formed are provided with one electric connecting pole each.

A cylindrically shaped resistive current limiter is disclosed in EP 0 525 313. According to this proposal in a hollow cylinder made of an superconducting material also slots are cut alternately from the upper and the lower end of the hollow body, said slots extending parallel to the longitudinal axis of the hollow cylinder. Also in this embodiment the active length of the current flow is increased wherein the current flowing up and down.

According to another solution a long stripe made of a superconducting material is wound such that it forms a flat bifilar coil and is arranged on a substrate. Due to the bifilar form the active length is significantly increased and the overall area occupied by the bifilar coil is nevertheless small.

European Patent Application No. 02 292 449.2 discloses a cylindrical hollow body into which a coil or a bifilar coil is cut which are usable for a resistive current limiter.

One of the main obstacles in the application of superconductor components in current limiters is the occurring large electrical field on the superconductor component during fault, such as short circuit or in the case of lightning strokes. Therefore in superconductor components as referred to above wherein current flows in adjacent turns as is the case in coils insulation between adjacent turns is necessary to prevent electric discharges.

Moreover, in short circuit case and in particular during lightning strokes the high voltage typically progresses with a steep ramp along the conductor. The voltage difference therefore increases with increasing conductor length.

The bifilar geometry or the meander concept in axial direction of a cylinder as referred to above, however, have the disadvantage that the on- and outgoing end of the superconducting path in each component are close to each other. Because of the long conductor length, usually several meters, are large voltage establishes between both ends. Therefore, sufficient insulation is difficult and requires insulation material of considerable thickness.

Further, during quenching the superconductor material is significantly heated up. For returning into the superconducting state rapid cooling is necessary. However, necessary minimation of the recooling rates is not possible when using thick insulation layers.

Thus, there was a need for a superconductor component useful as resistive current limiter wherein local electric fields occurring between neighbouring conductor segments are as small as possible so that no insulation is necessary at all or sufficient electrical insulation is achieved with only a thin insulation layer.

OBJECTS AND SUMMARY OF THE INVENTION

According to the present invention this problem is solved by a cylindrical superconductor component wherein the cylindrical superconductor body of the superconductor component is provided with a longitudinal slot which extends at a distance from the one end to a distance of the other end of the cylindrical body leaving a non-cut section between the one end and the other end, respectively, of the superconductor body and the starting point and end point, respectively, of the longitudinal slot, and a number of azimuthal slots incised vertically to the longitudinal slot into the cylindrical body, wherein each azimuthal slot is cut into the cylindrical body starting from the longitudinal slot and extending along the perimeter of the cylindrical body until an end point with a distance from the longitudinal slot, the distance between the longitudinal slot at the starting point of the respective azimuthal slot and the end point defining a non-cut section on the perimeter of the cylindrical body, wherein the azimuthal slots are cut into the perimeter of the cylindrical body in parallel and alternating.

The specific arrangement of the slots in the cylindrical superconductor component of the present invention has the advantage that current flows in opposite direction in adjacent path segments defined by the slots and, thus, magnetic self-fields generated by the current nearly compensate each other, thereby inductions and eddy current losses can be reduced.

Due to these advantages the cylindrical superconductor component of the present invention is particularly useful as resistive current limiter, in particular for AC, in order to avoid the creation of high short-circuit currents, especially in power stations, and to prevent destruction of plant components such as generators and transformers.

The superconductor component in accordance to the present invention usually has a cylindrical or substantially cylindrical basic shape.

A suitable starting geometry for the superconductor component is a rod or a tube, a cuboid with very rounded edge regions or a similar geometry, above all with substantially cylindrical external geometry. Within the meaning of the present invention superconductor components having such a shape are referred to "cylindrical superconductor component".

Solid bodies can be converted into the corresponding hollow body by mechanical processing. The cylindrical superconductor component should, if appropriate, have a maximally uniform thickness, in particular a cylindrical cavity concentric with the external surface.

In principle, however, other cross-sections for the superconductor component and cavity may also be used.

The cylindrical superconductor component may be made from tubes, similar hollow or solid bodies.

In principle the present invention may include any desired ceramic superconductor. Typical examples comprise oxide superconductors based on Bi-Ae-Cu—O, (Bi, Pb)-Ae-Cu—O, (Y, Re)-Ae-Cu—O or (Tl, Pb)-(Ae, Y)—Cu—O.

In the above formula Ae means at least one alkaline earth element, particularly, Ba, Ca and/or Sr.

Re means at least one rare earth element, particularly Y or a combination of 2 or more of the elements Y, La, Lu, Sc, Sm, Nd or Yb.

Particularly, preferred examples have a composition of or approximately of $Bi_2(Sr, Ca)_2Cu_1O_x$, $(Bi, Pb)_2(Sr, Ca)_2Cu_1O_x$, $(Bi, Pb)_2(Sr,Ca)_3Cu_2O_{x'}$, $(Bi, Pb)_2(Sr, Ca)_4Cu_3O_{x''}$, $(Y, Re)_1Ba_2Cu_3O_y$, $(Y, Re)_2Ba_1Cu_1O_{y'}$, $(Tl, Pb)_2(Ba, Ca)_2Cu_1O_z$ $(Tl Pb)2(Ca, Ba)_3Cu_2O_{z'}$, $(Tl, Pb)_2(Ca, Ba)_4Cu_3O_{z''}$, $(Tl, Pb)_1(Ca, Ba)_3Cu_2O_{z'''}$, $(Tl Pb)_1(Ca, Ba)_4Cu_3O_{z''''}$.

In the above formula x, y and z stand for the appropriate oxygen content at which the respective compounds exhibit superconductivity.

Especially suitable superconductors are those known by the reference BSCCO-2212, BSCCO-2223, wherein the numerical combinations 2212 and 2223 stands for the stoichiometric ratios of the elements Bi, Sr, Ca and Cu, in particular those, wherein part of Bi is substituted by Pb; and those known by the reference YBCO-123 and YBCO-211, wherein the numerical combinations 123 and 211 stand for the stoichiometric ratios of the elements Y, Ba and Cu.

On demand further elements may be present in the superconductor material. For example, BSCCO based superconductor materials may contain $SrSO_4$ and/or $BaSO_4$ as auxiliaries in an amount up to 20 percent by weight or when $BaSO_4$ is used, preferably only up to about 10 percent by weight.

Such compounds are disclosed for example in EP-A-0 524 442 and EP-A-0 573 798 to which reference is explicitly made.

In general, ceramic oxide high-temperature superconductors as, for example, referenced above and methods for their production are well known in the art. A summary of suitable high-temperature superconductors and production method thereof is given in WO 00/08657.

In principle the cylindrical superconducting component can be made from a pre-fired, sintered or post-annealed superconducting material. In order to obtain a high-quality superconductor material it is in principle necessary to perform the process stages of pre-firing, such as e.g. calcining, sintering and optionally post-annealing, which may be carried out in a single firing operation or in several, possibly even repeated, substages. However, it is also possible, to start with a high-quality superconducting material, which contains a high proportion of one or more superconducting phases.

YBCO-based superconductor bodies can be, for example, prepared by mixing the metal oxides, or compounds which are converted to metal oxides on heating, in suitable molar ratios, heating the mixture in the presence of oxygen to a temperature of between about 800 and about 1100° C. and slowly cooling the mixture in the presence of oxygen over a period of at least about 1 hour.

BSCCO-based superconductor bodies can be prepared by mixing oxides, carbides or carbonates or mixtures of the respective elements in suitable mixing ratios. Subsequently, calcining is carried out at a temperature of about 700 to 900° C. for a period of about 2 to about 20 hours, the calcined mixture is ground, converted into the desired shape and sintered at a temperatures of about 800 to about 1100° C. in the semi- or fully-molten state. Examples of suitable BSCCO-based compounds and production methods thereof are found, for example, in EP-B-0 330 305 and EP-A-0 327 044, to which reference is expressly made here.

Particularly preferred are superconducting bodies produced using a molten casting method, in particular are centrifugal casting method as disclosed, for example, in DE-A-38 30 092, EP-A-0 451 532, EP-A-0 462 409 and EP-A-0 477 493, to which reference is likewise expressly made.

For example, in EP 0 462 409 a process for the production of tubular superconductor bodies is disclosed, wherein an oxide starting mixture is allowed to run in a predetermined stoichiometry at temperatures from 900 to 1100° C. into a casting zone rotating about its horizontal axis. The solidified shaped body is taken out of the casting zone and heat-treated for 4 to 150 hours at 700 to 900° C. in an oxygen containing atmosphere. This process is particularly suitable for BSCCO-based superconductor bodies.

BRIEF DESCRIPTION OF THE DRAWINGS

In the following the present invention is explained in more detail with reference to the figures showing a preferred embodiment of the present invention without being limited to this specific embodiment It is shown in FIG. 1 schematically an embodiment of the cylindrical superconductor component of the present invention from the side with the longitudinal slot; and in FIG. 2 the embodiment of FIG. 1 in the developed state.

DETAILED DESCRIPTION

Figures 1, 2:
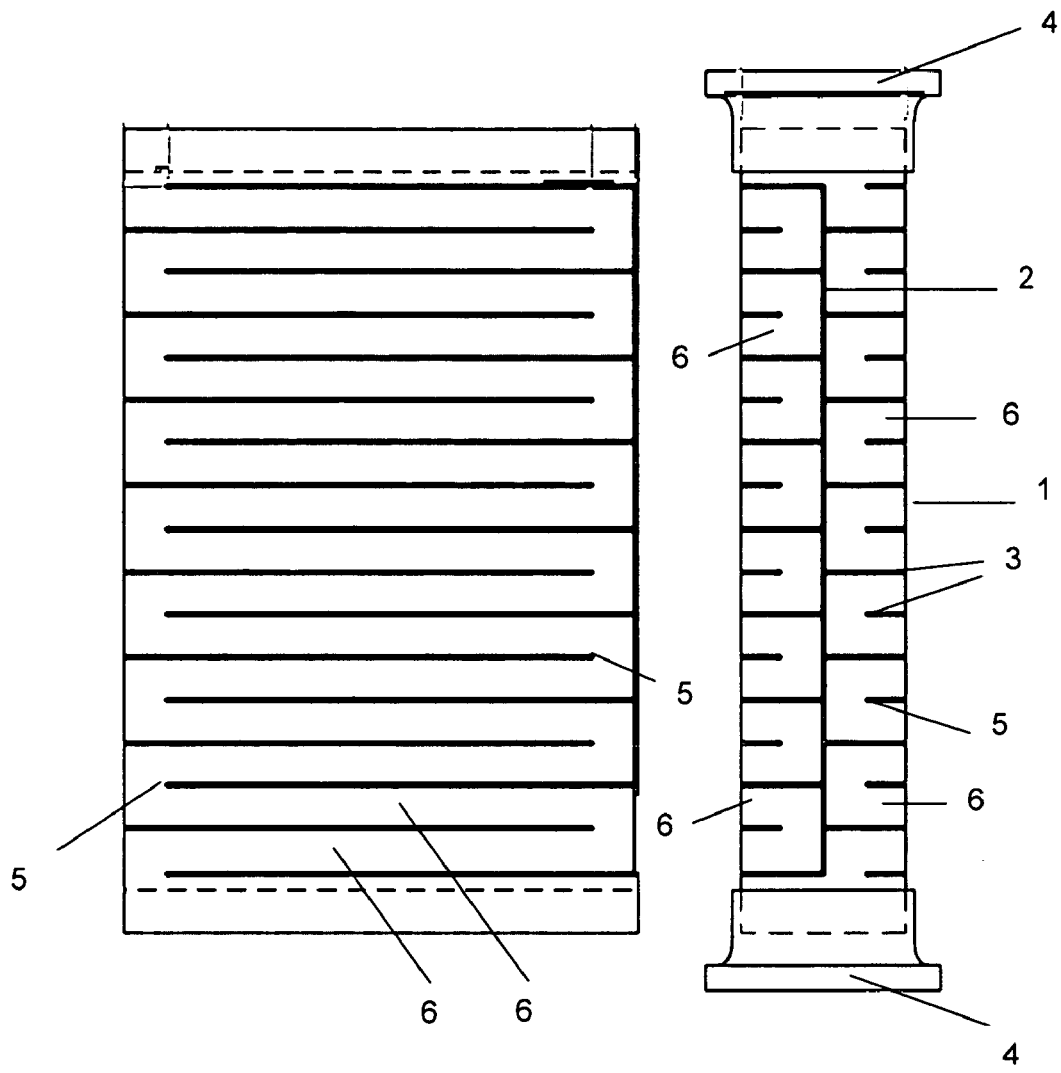

As is shown in FIG. 1 the longitudinal slot 2 reaches from one end of the superconductor body 1 to the other end leaving a non-cut region on both sides each located between the respective edge of the superconductor body 1 and the longitudinal slot 2.

The longitudinal slot 2 extends in parallel to the longitudinal axis of the superconductor body 1.

Along the length of the superconductor body defined by the longitudinal slot 2 and vertically to the longitudinal slot 2 azimuthal slots 3 are cut into the perimeter of the superconductor body in parallel and alternating.

Each azimuthal slot 3 starts from the longitudinal slot 2, circumferences the perimeter of the superconductor body 1 until an end point 5, wherein the distance between the end point 5 and the starting point of the respective azimuthal slot 3 at the longitudinal slot 2 defines a non-cut region in the perimeter of the superconductor body 1. An azimuthal slot 3 is provided at each end of the longitudinal slot 2. Between these two slots 3 at each end of the longitudinal slot 2 a number of further azimuthal slots 3 is provided in parallel and in an alternating manner. Incoming current flows from one end of the superconductor body to the other end along the path in windings 6 defined by the longitudinal slot 2 and the azimuthal slots 3.

For the present invention the term "windings" means a path segment on the superconductor body 1 between two adjacent azimuthal slots 3.

Due to the specific design of the slots 2, 3 in adjacent windings 6 the current flows in opposite direction. For illustration purposes the superconductor component of the present invention is shown in FIG. 2 in the developed state. In FIG. 2 the longitudinal slot 2 is indicated at the right side. Current flowing, for example, from the top to the bottom is supplied to the first winding form the left end side of the top and flows from the left to the right side until the end point 5 of the slot, turns to the next winding and flows from right to left and so on until the lowest winding at the bottom end where the current leaves the superconductor component.

The advantage of the design of the present invention is that along the whole electric path the path length between adjacent windings is small. Consequently the local voltage and the voltage difference in fault case between adjacent windings is only small. Since the voltage difference is only small there is almost no risk of electric discharge in fault case.

Moreover, since in adjacent windings the current flows in opposite direction the magnetic self-fields generated by the current flowing through adjacent windings is reduced by each other or even compensated.

The width of the longitudinal slot 2 and of the azimuthal slots 3 is not particularly restricted and can be selected according to need.

For example, preferably the width is selected sufficiently large in order to obtain sufficient insulation between adjacent windings. If sufficient insulation is provided by the slots provision of insulation material can be omitted saving not only costs but resulting in improved cooling performance of the superconductor component.

For providing sufficient insulation at the turning points of adjacent windings 6, that is to say the region at the end 5 of the azimuthal slot 3, at both sides of the longitudinal slot 2, if necessary, the width of the longitudinal slot 2 can be selected sufficiently larger than the width of the azimuthal slots 3. Specific values are given in the example below. However, as is clear, these values may vary in accordance to the actual dimension of the superconductor component.

From FIG. 2 showing the incised cylindrical superconductor body 1 in accordance to the present invention in the developed state it is recognisable that the superconductor material traces a path wherein the course of the path is comparable with a meandering tape. Generally the electrical properties such as critical current density and current carrying capacity of a superconductor body are defined by its cross-section. That is to say these properties increases with increasing cross-section.

In the present invention the cross-section of the path formed by the superconductor material can be defined by the wall thickness of the cylindrical superconductor body, the width of the path defined by the perpendicular line between two adjacent azimuthal slots 3 and the length of the perpendicular line between the end point 5 of each azimuthal slot 3 and the longitudinal slot 2.

Usually, said distance between two adjacent azimuthal slots 3 and said distance between the end point 5 of an azimuthal slot 3 to the longitudinal slot 2 can be the same or substantially the same. However, if appropriate, these distances may differ. For example, it could be appropriate to have different cross-sections along the windings 6 and at the turning point for achieving improved current flow and electrical behaviour, respectively.

Further, the shape of the azimuthal slot 3 at its end point 5, that is to say the shape of the bottom of the slot 3, can be freely chosen according to need. Usually, on practical reasons in view of easier production, the bottom has a angular shape such as a rectangular shape. But it is also possible to have it rounded if desirable for achieving improved electrical behaviour.

As indicated in FIG. 1 by reference number 4 on the non-cut regions at both ends of the superconductor body electrical contacts can be provided for connecting the superconductor body with further electrical equipment.

The electrical contacts 4 are preferably formed from silver sheets. These contacts may, however, also have burned-in metal contacts or sheet contacts based on metals other than silver, e.g. copper.

Further, a shunt can be applied on the external surface of the superconductor component of the present invention. Such shunt is made of normal conducting material whose resistance is lower than the resistance of the superconducting material in its normal conducting state. It is well known, to provide superconductor components with such shunt of normal conducting material in order to avoid overheating of the superconductor material and generation of so called "hot spots". In case of a certain temperature increase, for example in a limitation event due to short circuit, current is by-passed to the shunt and heat is dissipated.

As the material for the shunt, in principal, all materials are suitable, which have an appropriate resistance to limit the fault current to a desired value. Such a material may, for example, be a correspondingly conductive plastic, but a metal is preferred. Specific examples for metals are copper, a copper alloy, such as CuNi, and stainless steel. For example, CuNi alloy has a resistance of 30 µΩ/cm and stainless steel of 50 µΩ/cm at 77 K.

The shunt material can be applied on the external surface of the cylindrical superconductor body by any suitable method. For example, the shunt can be applied by soldering.

For example, for providing the external surface of the cylindrical superconductor component with a shunt a metal cladding can be soldered on the external surface of the superconductor body prior to the incision of the slots. Then, the slots can be cut into both the cladding material and the superconductor material.

Usually, the shunt is in electrical contact with the end sections of the cylindrical superconductor body designed as electrical contacts 4.

Further, the cylindrical superconductor component of the present invention can be provided with a reinforcing element for enhancing the mechanical stability.

For example, into the cavity of the cylindrical superconductor component a correspondingly cylindrically shaped reinforcing element can be fitted made of non-conducting or substantially non-conducting material such as glass fibre reinforced plastic.

The cylindrically shaped reinforcing element can be a solid or hollow body, a hollow body such as a tube or pipe, being preferred.

The dimensions of the cylindrically shaped reinforcing element are adjusted to fit to the dimensions of the cavity of the cylindrical superconductor body. The longitudinal length of both the cylindrically shaped reinforcing element and the cylindrical superconductor body may be the same or essentially the same. Usually, for simpler handling, the length of the cylindrically shaped reinforcing element is selected a little bit larger.

The reinforcing element is fixed to the superconductor component by appropriate means for avoiding unintentional slipping out. For example, the external surface of the reinforcing element can be soldered or sticked to the internal surface for the cylindrical superconductor component.

For application in a resistive current limiter more than one superconductor component in accordance of the present invention can be present. These superconductor components can be connected to one another in parallel or in series, in series being preferred.

For illustration purposes in the following example a specific embodiment of the cylindrical superconductor component of the present invention is given in more detail by reference to FIG. 1.

The cylindrical superconductor component is prepared starting from a cylindrical superconductor body made of BSCCO 2212 with a length of 280 mm and an outer diameter of 50 mm and an inner diameter of 46 mm. On the external surface of the superconductor component a cladding or tube of CuNi alloy is soldered having a thickness of 2 mm (not shown).

A longitudinal slot 2 is incised into the cylindrical superconductor body in parallel to the longitudinal axis leaving on both ends of the superconductor body non-cut end sections of 20 mm length.

As shown in FIG. 1 a number of azimuthal slots 3 is incised, in parallel and alternating, in perpendicular to the longitudinal axis, wherein each azimuthal slot 3 starts from the longitudinal slot 2. As can be seen from FIG. 1 longitudinal slot 2 is provided at both of its ends with an azimuthal slot 3, which have in this embodiment the same direction. Further, in this embodiment the azimuthal slots 3 and the longitudinal slot 2 have the same width of 2 mm. As set out above the width of the slots 2,3 is not particularly restricted and can be selected according to need. For example in this embodiment also a width of 1 mm is possible for the slots 2,3.

The distance between adjacent azimuthal slots 3 defining the width of the path at this segment as well as the perpendicular line from the end point 5 of an azimuthal slot 3 to the longitudinal slot 2 is e.g. 15 mm.

On both ends of the cylindrical superconductor body electrical contacts 4 made of copper are provided which embrace the cylindrical superconductor body to a depth of e.g. 15 mm leaving a gap of 5 mm between the edge of the contact 4 close to the first azimuthal slot 3 and this azimuthal slot 3.

LIST OF REFERENCE NUMBERS 1 cylindrical superconductor body
2 longitudinal slot
3 azimuthal slot
4 contact
5 end point of azimuthal slot 3
6 winding

The invention claimed is:

1. A cylindrical superconductor component comprising:
a cylindrical superconductor body, wherein the cylindrical superconductor body is provided with a longitudinal slot extending parallel to the longitudinal axis of the superconductor body at a distance from the lower end to a distance of the upper end of the cylindrical superconductor body, leaving a non-cut section between the lower end and the upper end, respectively, of the cylindrical superconductor body, and the starting point and the end point, respectively, of the longitudinal slot, and a number of azimuthal slots incised vertically to the longitudinal slot into the cylindrical superconductor body,
wherein each individual azimuthal slot is cut into the cylindrical superconductor body starting from the longitudinal slot and extending along the perimeter of the cylindrical superconductor body until an end point with a distance from the longitudinal slot, said distance between the longitudinal slot at the start of the respective azimuthal slot and the end point defining a non-cut section on the perimeter of the cylindrical superconductor body,
wherein the azimuthal slots are cut into the perimeter of the cylindrical superconductor body in parallel and
wherein each individual azimuthal slot starts from said longitudinal slot in a sense along the perimeter of the cylindrical body opposite to the sense of the azimuthal slots immediately neighbouring the individual slot along the longitudinal slot.

2. Cylindrical superconductor component according to claim 1, wherein the cylindrical superconductor body is made of a high temperature superconductor material.

3. Cylindrical superconductor component according to claim 1, wherein the high temperature superconductor material is selected from Bi-Ae-Cu—O, (Bi, Pb)-Ae-Cu—O, (Y, Re)-Ae-Cu—O and (Tl, Pb)-(Ae, Y)-Cu—O, wherein Ae means at least one alkaline earth element and Re means at least one rare earth element.

4. Cylindrical superconductor component according to claim 1, wherein the high temperature superconductor material is selected from high temperature superconductor materials based on BSCCO-2212 or BSCCO-2223.

5. Cylindrical superconductor component according to claim 1, wherein on the external surface of the superconductor body a shunt of normal conducting material is applied.

6. Method for producing a cylindrical superconductor component, said method comprising the steps of
providing a cylindrical superconductor body with a longitudinal slot and vertically to the longitudinal slot with a number of azimuthal slots,
extending the longitudinal slot a distance from the lower end to a distance of the upper end of the cylindrical superconductor body leaving a non-cut section between the lower end and the upper end, respectively, of the superconductor body and the starting point and end point, respectively, of the longitudinal and
incising the number of azimuthal slots 3 in parallel and alternating and wherein each azimuthal slot is cut into the cylindrical superconductor body starting from the longitudinal slot and extending along the perimeter of the cylindrical superconductor body until an end point with a distance from the longitudinal slot, the distance between the longitudinal slot at the starting point of the respective azimuthal slot and the end point defining a non-cut section on the perimeter of the cylindrical superconductor body wherein each individual slot starts from said longitudinal slot in a sense along the perimeter of the cylindrical body opposite to the sense of the azimuthal slots immediately neighboring the individual slot along the longitudinal slot.

7. Method according to claim 6, wherein a cylindrical superconductor body is used having a cladding of a normal conducting metal applied on its external surface, and cutting the slots into both the cladding as well as the superconductor material.

8. Method in accordance to claim 6, the cylindrical superconductor body is made of BSCCO-2212 or BSCCO 2223.

9. Method according to claim 6, wherein the material for the cladding is selected from copper, copper-alloy or stainless steel.

10. Resistive current limiter comprising: at least one cylindrical superconductor component in accordance with claims 1.

11. A resistive current limiter in accordance to claim 10, wherein the cylindrical superconductor components are connected to one another in parallel or in series.

* * * * *